United States Patent [19]
Wang

[11] Patent Number: 5,185,769
[45] Date of Patent: Feb. 9, 1993

[54] EASILY TESTABLE HIGH SPEED DIGITAL COUNTER

[75] Inventor: Ling-Ling Wang, Taipei, Taiwan
[73] Assignee: Acer Incorporated, Taiwan, Taiwan
[21] Appl. No.: 777,688
[22] Filed: Oct. 15, 1991
[51] Int. Cl.$^5$ ............................................. H03K 21/40
[52] U.S. Cl. ...................................... 377/29; 377/28; 377/55
[58] Field of Search .............................. 377/29, 28, 55

[56] References Cited

U.S. PATENT DOCUMENTS

| | | | |
|---|---|---|---|
| 4,736,395 | 4/1988 | Sugihara | 377/29 |
| 4,860,325 | 8/1989 | Aria et al. | 377/29 |
| 4,979,193 | 12/1990 | Mehta | 377/29 |

Primary Examiner—John S. Heyman
Assistant Examiner—Scott A. Ouellette
Attorney, Agent, or Firm—Greg T. Sueoka

[57] ABSTRACT

A high speed digital counter that can be easily tested comprises a plurality of subcounters having an input for receiving an incrementing signal and a carry output for outputting a carry signal when the subcounter has reached its counting capacity. The carry output of each subcounter is gated to the input of a next more significant subcounter by an OR gate which receives as inputs the carry signal and a test signal. The OR gate performs an OR on these two signals and outputs the result to the input of the next more significant subcounter. The OR gate allows the test signal to access each subcounter separately, and thus, each subcounter may be tested individually.

7 Claims, 1 Drawing Sheet

EASILY TESTABLE HIGH SPEED DIGITAL COUNTER

BACKGROUND OF THE INVENTION

1. Field of the Invention

This invention relates to digital counters and more specifically to a high speed digital counter which may be tested quickly and easily.

2. Description of Related Art

Digital counters are used in a variety of applications ranging from signal communications to digital processing systems and may be the most widely used component in electronic products. Basically, a digital counter receives at its input an incrementing signal. Each time this signal is received along with a clock signal, the counter increments its output by one. Thus, the counter keeps a count of the number of times the incrementing signal has occurred.

In a number of applications, such as when the incrementing signal has a high frequency, the counter's ability to increment at high speed becomes crucial. In these applications, a carry-look-ahead circuit is usually implemented to accommodate the high speed operation. However, as the size of the counter increases, the use of a carry-look-ahead circuit becomes both physically and economically infeasible. As a compromise between performance and practicality, a number of high count, high speed counters have been implemented by chaining together a plurality of multi-bit subcounters each of which utilizes an internal carry-look-ahead circuit. The carry over from each subcounter is propagated to the next more significant subcounter by way of a carry-ripple-adder input. Prior art counters of this type (chain counters) implement the carry over between the subcounters internally. Thus, the only point of access to the counter is the input port of the counter.

This limited access presents a significant problem when testing the counter. Since the individual subcounters cannot be accessed, the counter must be tested as a whole, which means that incrementing signals must be sent to the input of the counter to cause it to go through its entire count capacity. In a counter having ten bits, for example, it is necessary to send $2^{10}$ incrementing signals to the counter to fully test it. This method of testing is inefficient and undesirably time consuming. Also, because the subcounters cannot be tested individually, it is difficult to precisely pinpoint which subcounter is malfunctioning. As a result, even if only one subcounter is malfunctioning, it is still necessary to replace the counter because the individual subcounter that should be replaced cannot be determined. A counter that allows the malfunctioning subcounter to be identified is clearly more desirable. Therefore, there is a need for an improved high speed digital counter that can be readily tested.

SUMMARY OF THE INVENTION

The present invention is an improved high speed digital chain counter that allows each subcounter to be tested individually. The invention comprises: a first subcounter having an input for receiving an incrementing signal and an output for outputting a carry signal when the subcounter reaches its counting capacity; a second subcounter having an input for receiving the carry signal of the first subcounter; and a gating means for gating an external test signal to the input of the second subcounter. The gating means is preferably an OR-gate that performs an OR function on the test signal and the carry signal. Because an external test signal may be gated to the input of the second subcounter, each of the subcounters may be tested individually and simultaneously, thus, facilitating the testing of the entire counter in less time.

DETAILED DESCRIPTION OF THE INVENTION

Figure 1:
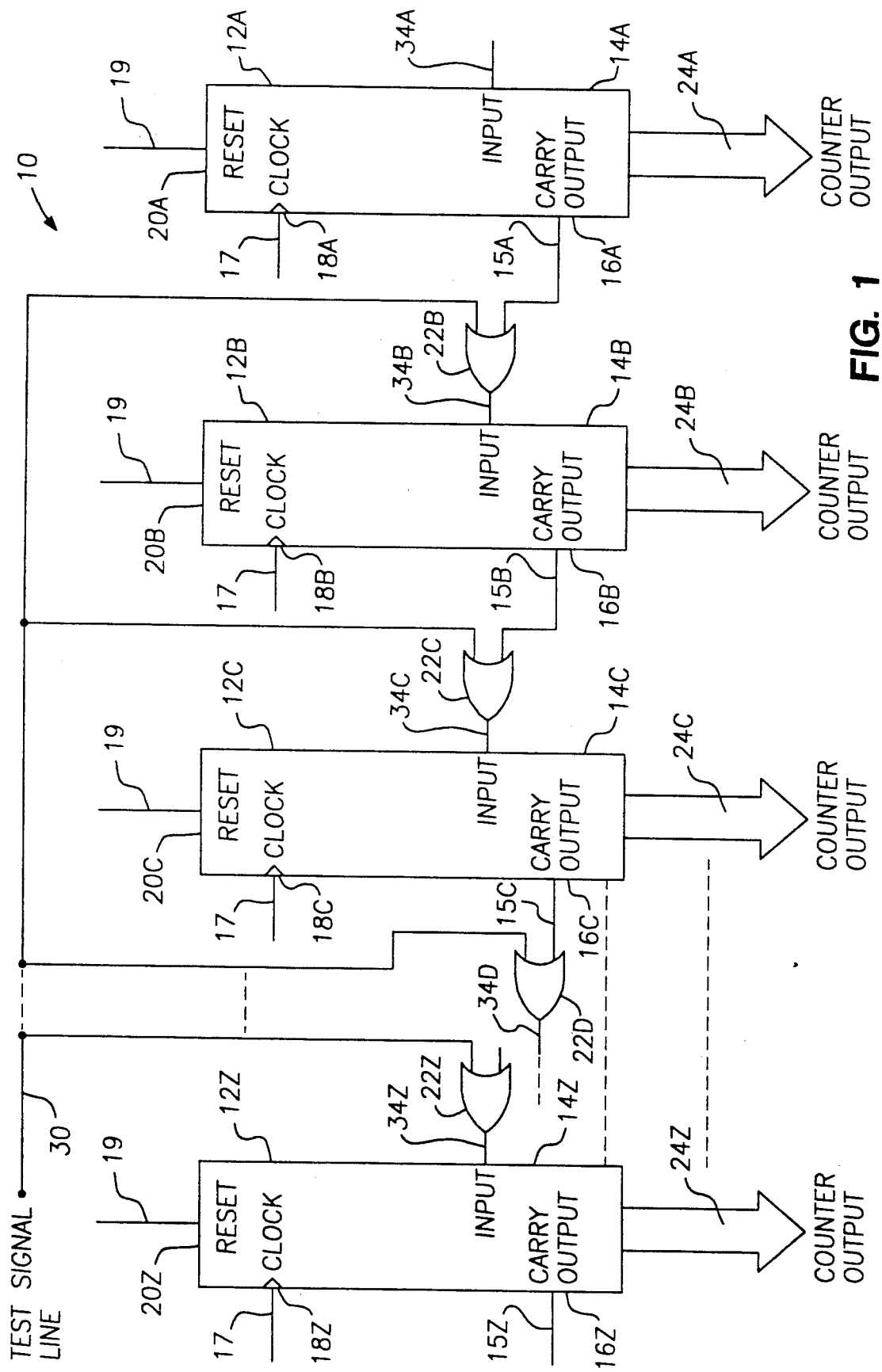
FIG. 1 is a circuit diagram of a preferred embodiment of the invention.

As shown in FIG. 1, a preferred embodiment of the digital counter 10 of the present invention comprises a plurality of subcounters 12a–12z each having an input port 14a–14z, ; a carry output port 16a–16z, a clock signal input port 18a–18z for receiving a clock signal 17, and a reset port 20a–20z for receiving a reset signal 19. The clock signal 17 synchronizes the operation of all the subcounters 12a–12z while the reset signal 19, when active, resets all of the subcounters 12a–12z to zero. Each of the subcounters 12a–12z is itself an n bit counter with a counting capacity of $2^n$. To accomodate high speed operation, each subcounter 12a–12z preferably includes a conventional carry-look-ahead circuit internally.

Each of the subcounters 12a–12z is designed to receive at its input port 14a–14z an incrementing signal the occurrence of which allows each respective subcounters 12a–12z to increment by one when the clock signal 17 is pulsed. The actual contents of each subcounter 12a–12z can be monitored on parallel data output lines 24a–24z. When the count in the subcounter 12a–12z reaches the counting capacity of the subcounter, that is, when the incrementing signal and clock signal has been detected $2^n$ times, the subcounter 12a–12z will generate a carry signal 15a–15z on its carry output port 16a–16z and reset itself to zero. It will then begin its count all over again.

Counter 10 comprises a plurality of these subcounters 12a–12z chained together such that the carry output 16a–16z of each subcounter 12a–12z is gated to the input 14b–14z of the next more significant subcounter. For example, the carry output 16a of subcounter 12a is coupled to the input 14b of subcounter 12b by a gate 22b and the carry output 16b of subcounter 12b is gated to the input 14c of subcounter 12c and so on. The gating function is performed by an OR-gate 22b–22z which receives as inputs a carry output signal 15a–15z and a test signal on line 30. Each OR-gate 22b–22z performs an OR operation on the two input signals and outputs the result on lines 34b–34z to the input 14b–14z of the next more significant subcounter 12b–12z. If either the test signal 30 or the carry output signal 15a–15z is active, the output 34b–34z will be active, thus, allowing the next more significant subcounter 12b–12z to increment by one. In essence, the OR-gates 22b–22z of the present invention allow the test signal 30 to reach the input 14b–14z of each subcounter 12b–12z, except for first subcounter 12a, individually so that each subcounter 12b–12z may be tested separately. This is in contrast to the counters of the prior art wherein the carry output 16a–16z of each subcounter 12a–12z was directly connected to the input 14b–14z of the next more significant subcounter 12b–12z. As will be discussed shortly, the individual access to each subcounter 12b–12z by the test signal 30 greatly simplifies the testing of the counter 10.

By chaining a plurality of subcounters 12a–12z in the manner described above, a counter 10 having a high bit count can be obtained. For example, a twelve bit counter may be implemented by chaining together three 4-bit subcounters. The number of subcounters and the number of bits per subcounter are parameters which may be chosen by the designer of the counter 10.

To illustrate the testing of the counter 10 of the present invention, suppose that a 12-bit counter comprising a chain of three 4-bit subcounters 12a–12c is to be tested. The testing begins by sending a clock signal 17 to the clock input 18a–18c of each subcounter 12a–12c to activate the subcounters. At the same time, an active reset signal 19 is sent to the reset input 20a–20c of each subcounter 12a–12c to reset all of the subcounters 12a–12c to zero. Next, after the reset signal 19 is removed and while clock signal 17 continues to be sent to the subcounters 12a–12c, the test signal line 30 is held active and passed through the OR-gates 22b–22c to subcounters 12b and 12c to allow incrementing. During the same period, the input 14a to counter 12a is held active (high). The data outputs of each subcounter 12a–12c can be monitored on output lines 24a–24c to make certain that the subcounters 12a–12c are functioning properly. After $2^4$ or 16 cycles of the clock signal 17, each subcounter 12a–12c has received enough test signals 30 to cause it to reach its counting capacity (1111 binary). The first 16 clock cycles test the data output 24a–24c for the subcounters 12a–12c and the output of the OR-gates 22b–22c to determine whether they respond properly when the test signal 30 is high and the carry signal 15a–15c is low. For the 17th testing clock cycle, the test signal 30 is held inactive (low) and the input 14a of the first subcounter 12a is held high. The carry output signals 15a–15c should be high since at the end of the 16th clock cycle each subcounter 12a–12c reach its counting capacity. The subcounters 12a–12c are then clocked which should cause them to output 0000 (binary). This cycle tests whether the subcounters 12a–12c are properly asserting the carry outputs 16a–16c and whether the OR-gates 22b–22c respond properly when the test signal 30 is low and the carry signals 15a–15c are high. Finally, in the 18th testing cycle, testing is completed by placing an active high signal on the input 14a to the first counter 12a and holding the testing signal 30 inactive (low). This last clock cycle serves to test the functioning of the OR-gates 22b–22z when both the carry signals 15b–15c and the test signal 30 are low. By the end of this clock cycle, if all of the components are working properly, the first subcounter 12a should output 0001 binary and counters 12b and 12c should output 0000 binary. At this point, the testing of the counter 10 is complete. The testing of OR-gates 22b–22c with a high carry signals 15a–15c and a high test signal 30 is not necessary since the OR-gates 22b–22c have already been tested with the signals alternatively high.

It should be noted that complete testing of the counter 10 required only $2^4+2$ or 18 clock cycles sixteen cycles for counting, and two cycles for testing the OR gates. Similarly, other counter with subcounters having more or less than 4 bits may be tested in $2^n+2$ where n equals the number of bits output by the subcounters. In contrast, prior art 12-bit counters would have required $2^{12}$ or 4096 clock cycles to test because the counter would have had to count through its entire count capacity. With counters having higher bit counts, the advantage of the present invention becomes even more apparent. Unlike the prior art, the present invention allows all the subcounters 12a–12z to be tested simultaneously and in parallel which significantly reduces the number of clock cycles needed for complete testing. The parallel testing provided by the present invention also allows a particular malfunctioning subcounter to be precisely and easily identified. Overall, the counter of the present invention provides superior testing performance over the digital chain counters of the prior art.

Although the invention has been described with reference to a specific embodiment, it should not be construed to be so limited. Many modifications may be made by one skilled in the art with the benefit of this disclosure without departing from the true spirit and the scope of the invention. Therefore, the invention should not be limited by the examples used to illustrate it, but only by the scope of the appended claims.

What is claimed is:

1. A digital counter comprising:
   a first subcounter having an input for receiving an incrementing signal and a carry output for outputting a first carry signal when the first subcounter reaches its counting capacity;
   gating means having a first and a second input and an output for gating a test signal, the first input coupled to receive a test signal, and the second input coupled to the carry output of the first subcounter to receive the first carry signal, the gating means performing an OR operation on the test signal and the first carry signal; and
   a second subcounter having an input coupled to receive the output of the gating means.

2. The counter of claim 1, wherein the first and second subcounters each further comprise:
   a reset input for receiving a reset signal; and
   a clock input for receiving a clock signal.

3. The counter of claim 1, wherein the first and second subcounters each comprise a carry-look-ahead circuit.

4. A digital counting system comprising:
   a first subcounter having an input for receiving an incrementing signal, and an output for outputting a first carry signal when the first subcounter reaches its counting capacity;
   a plurality of ith auxiliary subcounters, index i starting at 2, each having an output for outputting an ith carry signal when the ith auxiliary subcounter reaches its counting limit, and each subcounter having an ith input; and
   gating means having inputs coupled for receiving a test signal and an ith carry signal and having an output coupled to an input of an (i+1)th auxiliary subcounter for gating each respective carry signal and the test signal to the input of the next respective auxiliary subcounter, the gating comprising an OR operation.

5. The counting system of claim 4, wherein the gating means comprises a plurality of ith logic OR gates each having inputs for receiving the test signal and one of the ith carry signals, and an output, each ith logic gate performing an OR operation on the test and ith carry signals, and outputting the result of the OR operation to the input of the (i+1)th auxiliary subcounter.

6. The counting system of claim 5 wherein the first and ith auxiliary subcounters further comprise:
   a reset input for receiving a reset signal; and
   a clock input for receiving a clock signal.

7. The counting system of claim 6, wherein the first and auxiliary subcounters each comprise a carry-look-ahead circuit.

* * * * *